(12) United States Patent
Huang (10) Patent No.: US 9,253,906 B2
(45) Date of Patent: Feb. 2, 2016

(54) COVER WITH AN OPENING STRUCTURE

(71) Applicant: HON HAI PRECISION INDUSTRY CO., LTD., New Taipei (TW)

(72) Inventor: Ying-Jui Huang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/500,263

(22) Filed: Sep. 29, 2014

(65) Prior Publication Data

US 2015/0257292 A1 Sep. 10, 2015

(30) Foreign Application Priority Data

Mar. 4, 2014 (TW) .................................. 103107264

(51) Int. Cl.
| | |
|---|---|
| *H05K 5/03* | (2006.01) |
| *H05K 5/02* | (2006.01) |
| *E05D 7/00* | (2006.01) |
| *E05D 11/00* | (2006.01) |
| *A47B 96/00* | (2006.01) |

(52) U.S. Cl.
CPC .............. *H05K 5/0239* (2013.01); *A47B 96/00* (2013.01); *E05D 7/00* (2013.01); *E05D 11/00* (2013.01); *H05K 5/0226* (2013.01)

(58) Field of Classification Search
CPC .......... A47B 96/00; E05D 7/00; E05D 11/00; E05D 11/0054; E05D 11/10; H05K 5/0217; H05K 5/0239
See application file for complete search history.

(56) References Cited

U.S. PATENT DOCUMENTS

| | | | | |
|---|---|---|---|---|
| 2012/0134081 | A1* | 5/2012 | Zhao et al. | 361/679.01 |
| 2012/0331492 | A1* | 12/2012 | Qiu et al. | 720/647 |
| 2013/0105192 | A1* | 5/2013 | Huang | 174/50 |
| 2013/0285525 | A1* | 10/2013 | Zhao et al. | 312/319.2 |
| 2013/0314853 | A1* | 11/2013 | Wang | 361/679.01 |
| 2014/0139981 | A1* | 5/2014 | Kuo et al. | 361/679.01 |

FOREIGN PATENT DOCUMENTS

CN    201540509    8/2010

* cited by examiner

*Primary Examiner* — Daniel Rohrhoff
(74) *Attorney, Agent, or Firm* — Novak Druce Connolly Bove + Quigg LLP (57) ABSTRACT

A cover with an opening structure includes an enclosure defining an opening, a cover rotatably mounted to the enclosure, and a driver mounted in the enclosure. The cover is engaged with the enclosure to cover the opening. The enclosure includes a holder defining a first slot. The first slot includes a first position and a second position. The cover includes a connecting arm, a camshaft and a pivot protruding from opposite sides of the connecting arm, and the pivot is slidably located in the first slot. When the cover is covering the opening, the pivot is located at the first position, and the diver resists the camshaft elastically. When the cover is disengaged from the enclosure, the pivot is driven by release of elasticity to slide from the first position to the second position to rotate the cover to open.

20 Claims, 8 Drawing Sheets

COVER WITH AN OPENING STRUCTURE

FIELD

The present disclosure relates to covers over open structures, and particularly to a cover protecting ports.

BACKGROUND

Electronic devices have covers to cover interfaces, such as USB interfaces for protection. Covers are commonly pivoted on a housing of the electronic device.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like reference numerals indicate the same or similar elements. It should be noted that references to "an" or "one" embodiment in this disclosure are not necessarily to the same embodiment, and such references can mean "at least one."

FIG. 1-4 show a cover with an opening structure 10. The cover with an opening structure 10 includes an enclosure 20, a driver 40 mounted in the enclosure 20 and a cover 30 connected with the driver 40. The cover 30 is driven by the driver 40 to cover or to open up the enclosure 20.

The enclosure 20 includes a receiving portion 21 and a pair of holder 22. The receiving portion 21 is recessed into a top surface of the enclosure 20. The receiving portion 21 defines an opening 215.

The receiving portion 21 is box-like and further includes a pair of first sidewalls 210 and a second sidewall 211 perpendicular to the first sidewalls 210. The first sidewalls 210 and the second sidewalls 211 surround the opening 215. Each of the first sidewalls 210 defines an L-shaped slot 213, and the second sidewall 211 defines a pair of first through holes 214.

Figure 1:
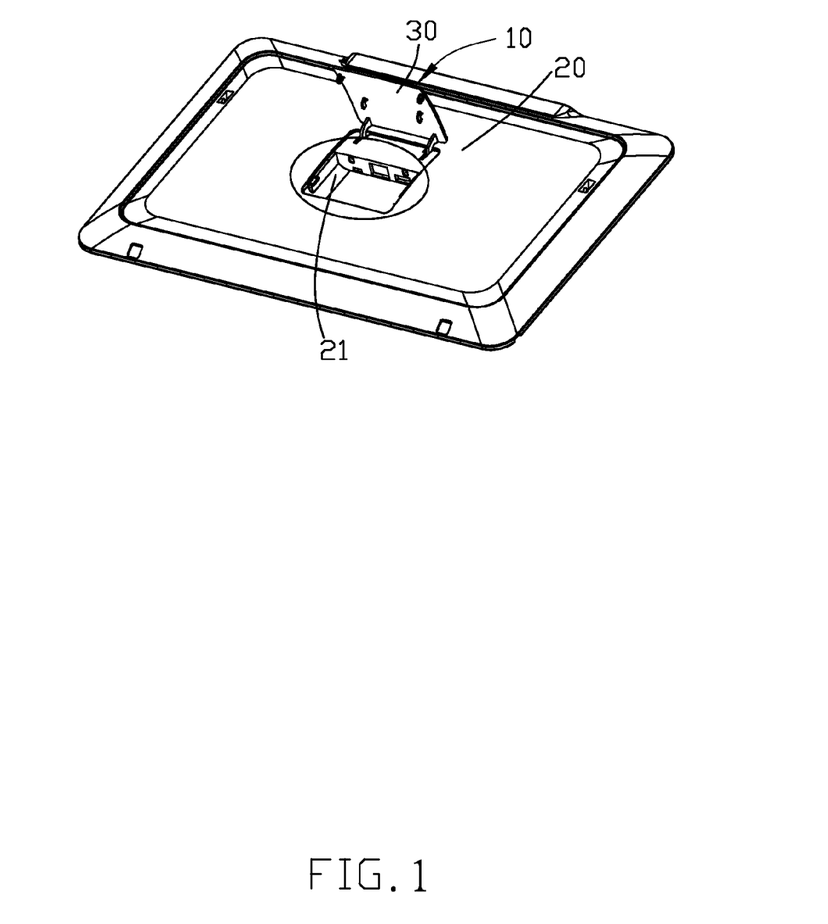
FIG. 1 is an isometric view of an embodiment of a cover with an opening structure.
Figure 2:
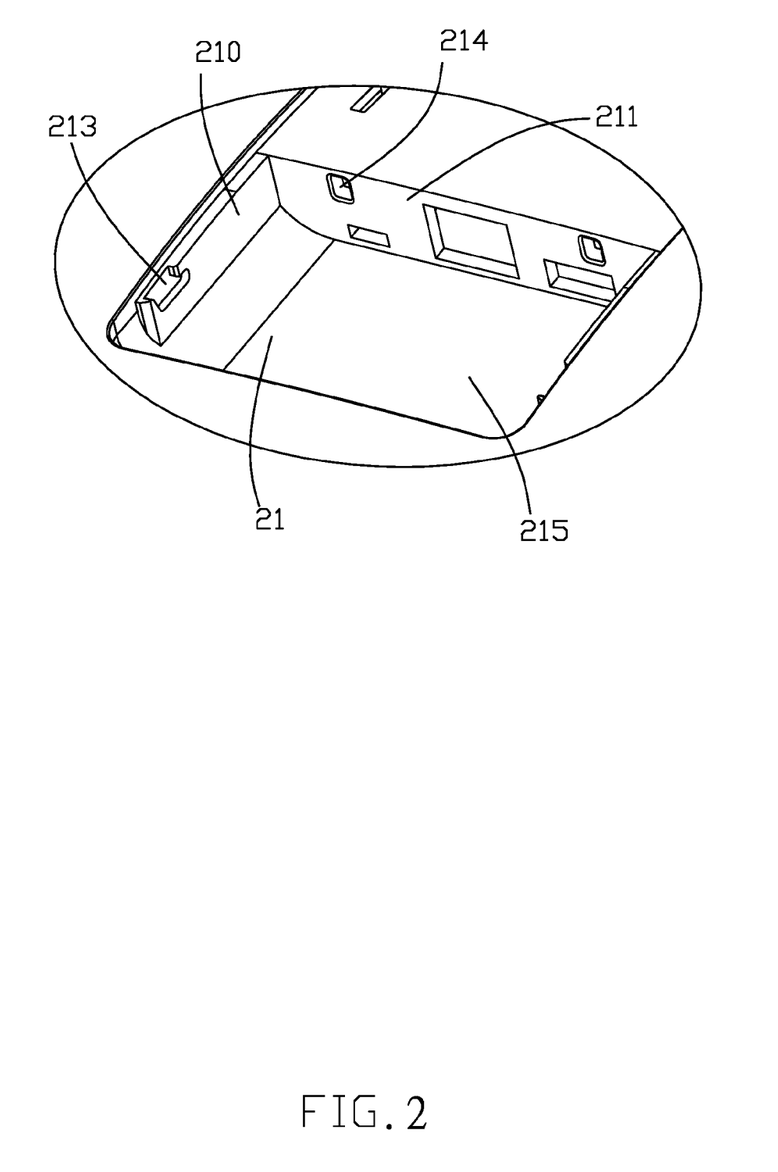
FIG. 2 is an enlarged isometric view of a portion of the cover with an opening structure of FIG. 1.
Figure 3:
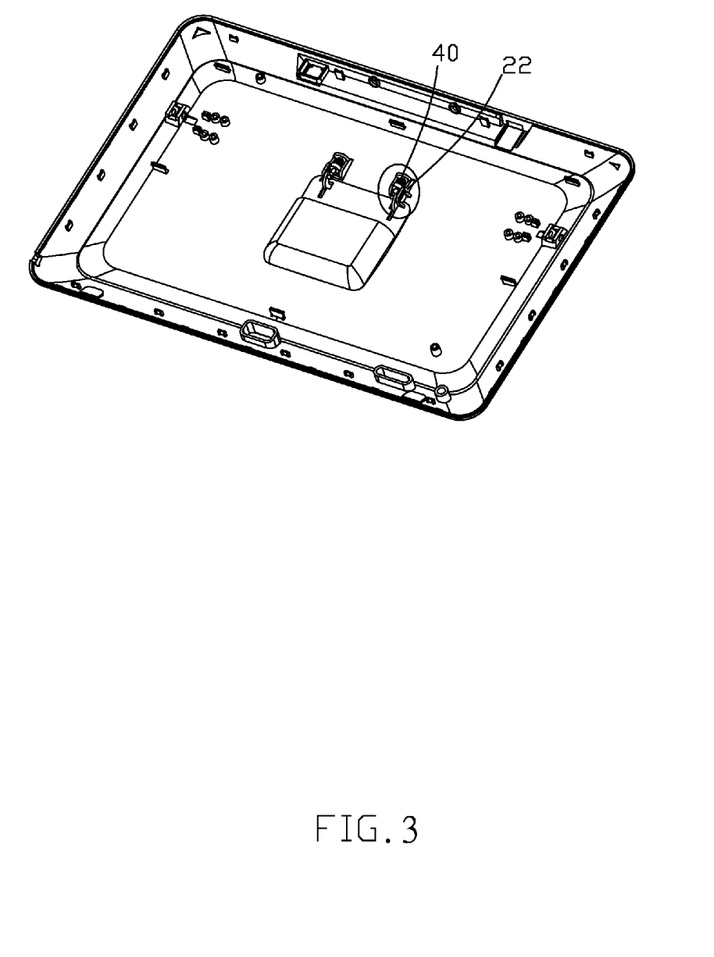
FIG. 3 is another isometric view of the cover with an opening structure of FIG. 1.
Figure 4:
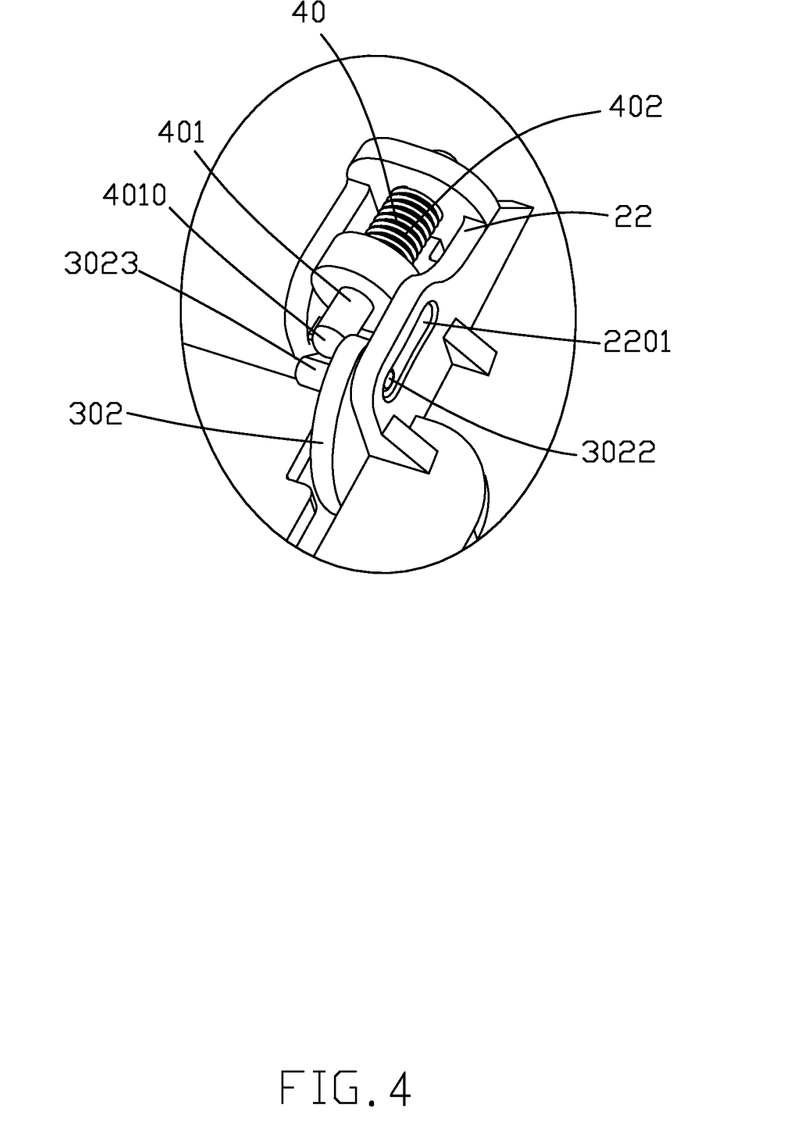
FIG. 4 is an enlarged isometric view of a portion of the cover with an opening structure of FIG. 3.
Figure 5:
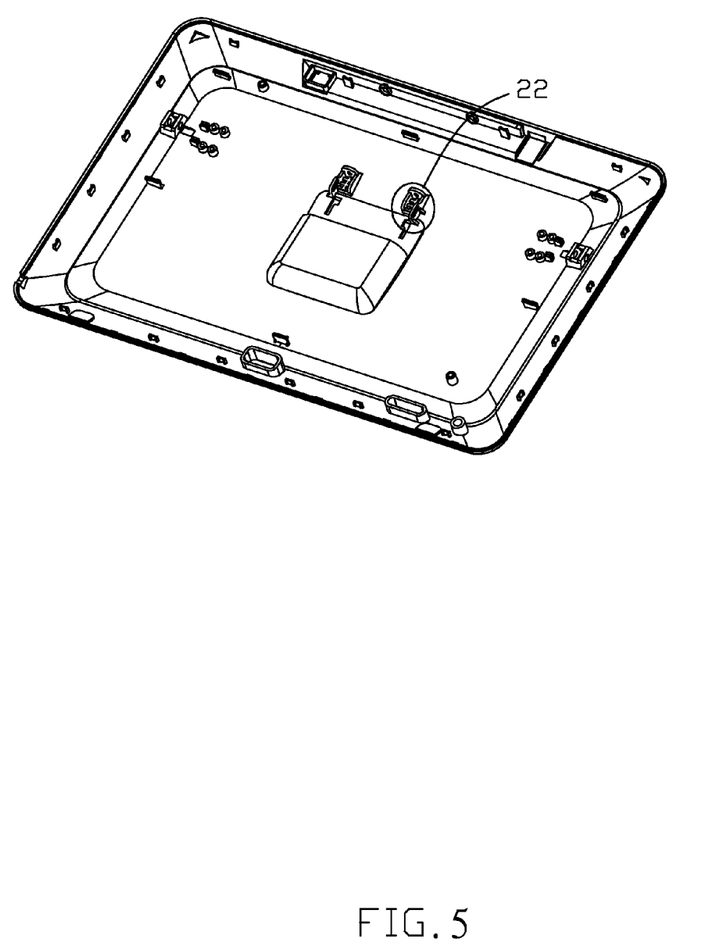
FIG. 5 is an isometric view of a holder of the cover with an opening structure of FIG. 1.
Figure 6:
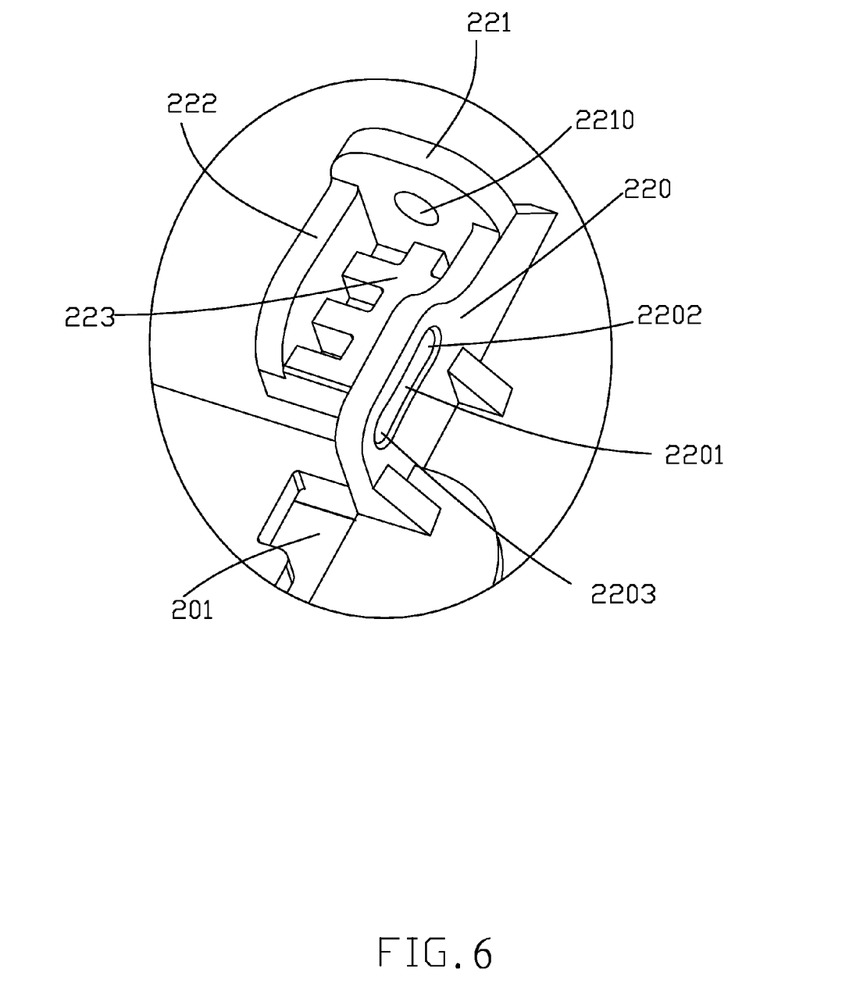
FIG. 6 is an enlarged isometric view of a portion of the holder of FIG. 5.
Figure 7:
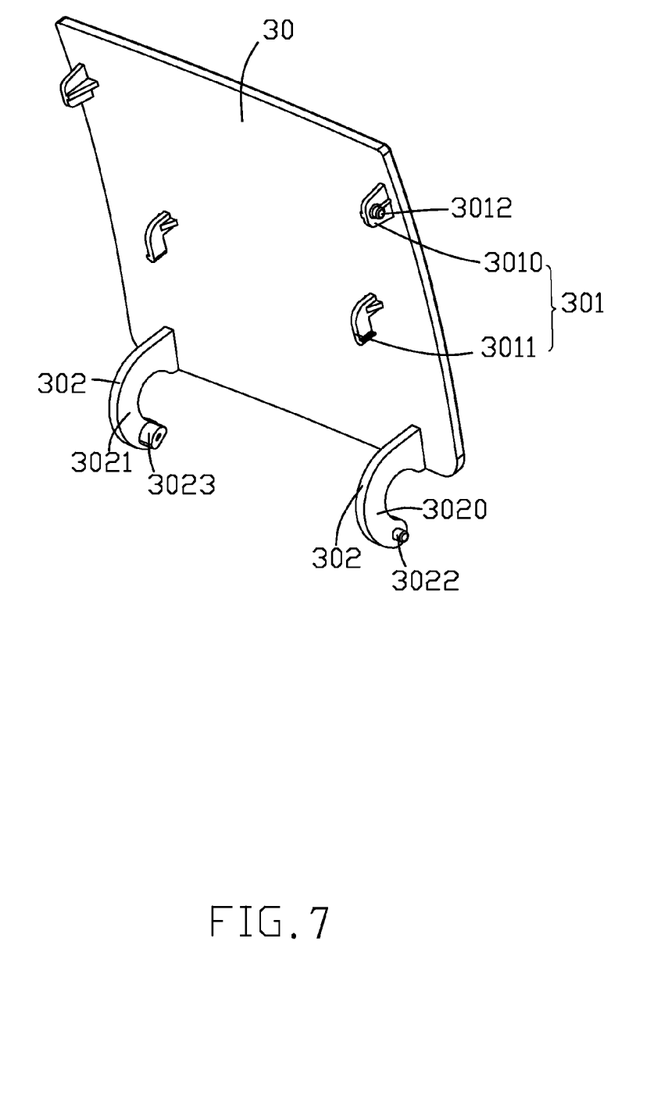
FIG. 7 is an isometric view of a covering of the cover with an opening structure of FIG. 1.

FIG. 5-7 show that the holders 22 protrudes from an underside surface of the enclosure 20, and are located adjacent the second sidewall 211. Each holder 22 includes a first positioning block 220, a second positioning block 221, and a third positioning block 222.

The first positioning block 220 and the third positioning block 222 are parallel to each other, and the second positioning block 221 is located between the first positioning block 220 and the third positioning block 222 to cooperatively define a receiving groove 223. The first positioning block 220 defines a slot 2201. The slot 2201 defines a first position 2202 and a second position 2203. The first position 2202 and the second position 2203 are opposite ends of the slot 2201. The second positioning block 221 defines a positioning hole 2210.

A second through hole 201 is defined in the enclosure 20 and is located between the holder 22 and the receiving portion 21.

Four hooks 301 and a pair of connecting arms 302 are located on a surface of the cover 30 facing the enclosure 20. The hooks 301 include two first hooks 3010 with cylinders 3012 to latch with the L-shaped slots 213, and two second hooks 3011 to latch with the first through holes 214. Each connecting arm 302 protrudes from a respective end of the cover 30.

A pivot 3022 protrudes from one side of the connecting arm 302, and a camshaft 3023 protrudes from the other side of the connecting arm 302. The pivot 3022 is opposite to the camshaft 3023. The connecting arms 302 passes through the second through holes 201, and the pivots 3022 are slidably located in the slots 2201, so that the cover 30 pivots on the enclosure 20.

Figure 8:
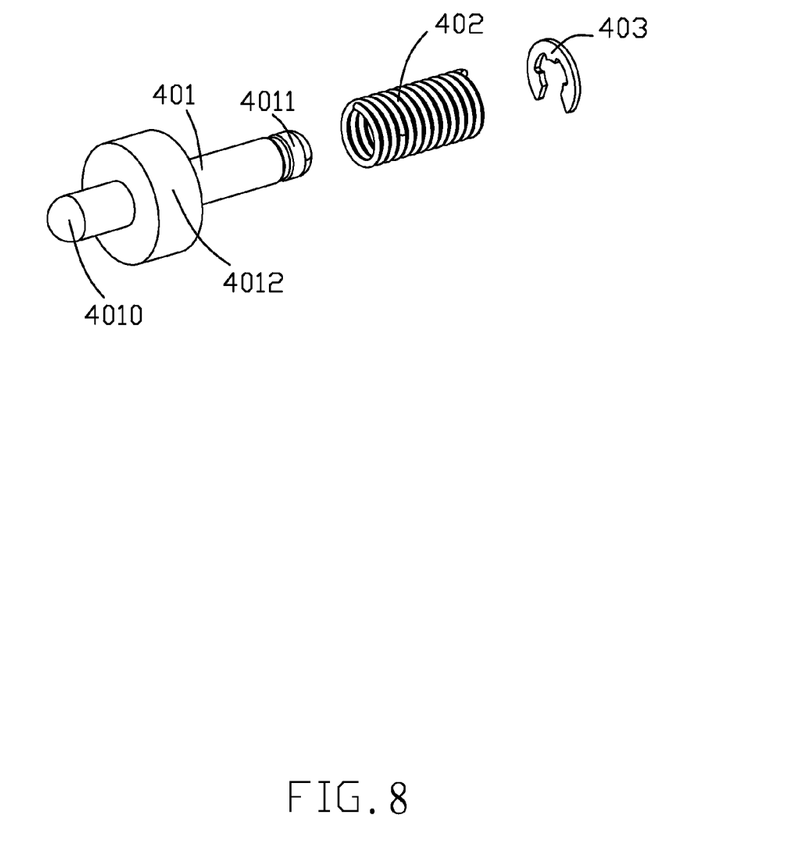
FIG. 8 is an exploded isometric view of a driver of the cover with an opening structure of FIG. 4.

FIG. 8 shows that the driver 40 includes a shaft 401, an elastic member 402, and a positioning element 403. The shaft 401 includes a first end 4010 and a second end 4011. A blocking element 4012 is located between the first end 4010 and the second end 4011, and the elastic member 402 is located between the blocking element 4012 and the second end 4011. The positioning member 403 is fixed at the second end 4011 and resists the second positioning block 221.

When the cover 30 is closed, the cover 30 is rotated towards the receiving portion 21, and is received in the receiving portion 21. A surface of the cover 31 away from the enclosure 20 is coplanar with the top surface of the enclosure 20. The camshaft 3023 pushes the shaft 401 to drive the pivot 3022 to move towards the first position 2202. The first hooks 3010 latch with the L-shaped slots 213, and the second hooks 3011 latch with the second through holes 214. The elastic member 402 is thereby compressed.

When the cover 30 is to be opened, the cover 30 is pushed away from the enclosure 20 to make the first hooks 3010 and the second hooks 3011 release from the enclosure 20. The shaft 401 is pushed by release of elasticity of the elastic member 402 to resist the camshaft 3023, so as to drive the pivot 3022 to move from the first position 2202 to the second position 2203, which rotates and opens the cover 30.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A cover with an opening structure, comprising:
   an enclosure defining an opening, the enclosure comprising a holder defining a first slot, the first slot comprising a first position and a second position;
   a cover rotatably mounted to the enclosure, the cover being engaged with the enclosure to cover the opening, the cover comprising:
   a connecting arm;
   a camshaft;

a pivot protruding from opposite sides of the connecting arm and, slidably located in the first slot; and
a driver mounted in the holder;
wherein the first position and the second position are at opposite ends of the slot, when the pivot is located at the second position, the holder resists the pivot to rotate the cover to open;
wherein when the cover is covering the opening, the pivot is located at the first position, and the diver resists the camshaft elastically; and
when the cover is disengaged from the enclosure, the pivot is driven by release of elasticity to slide from the first position to the second position to rotate and open the cover.

2. The cover with an opening structure of claim 1, wherein the driver comprises an elastic member and a shaft, when the cover is engaged with the enclosure to cover the opening, the camshaft resists the shaft to force the elastic member to be compressed, and when the cover is disengaged from the enclosure, the elastic force drives the pivot to slide in the slot to force the cover to rotate to open.

3. The cover with an opening structure of claim 2, the shaft comprising:
a first end which resists the camshaft;
a second end which passes through the holder; and
a blocking portion located between the first end and the second end;
wherein the elastic member is located between and is configured to resist the blocking portion and the holder.

4. The cover with an opening structure of claim 3, wherein the holder protrudes from an underside of the enclosure and comprises:
a first positioning block;
a second positioning block;
and a third positioning block parallel to the first positioning block;
wherein the second positioning block is located between the first positioning block and the third positioning to cooperatively define a receiving groove to receive the holder.

5. The cover with an opening structure of claim 4, wherein the first slot is defined in the first positioning block, the pivot is slid in the first slot, the second positioning block defines a positioning hole, the second end of the shaft passes through the positioning hole.

6. The cover with an opening structure of claim 5, wherein the driver further comprises a positioning element, the positioning element is fixed on the second end of the shaft, when the cover is engaged with the enclosure to cover the opening, the positioning element resists the second positioning block.

7. The cover with an opening structure of claim 1, wherein at least one hook is located at one of the enclosure and the cover, at least one second slot is located at the other one of the enclosure and the cover, and the hooks are latched into the second slots.

8. The cover with an opening structure of claim 7, wherein the hook comprises a cylinder, and the second slot is L-shaped.

9. A cover with an opening structure, comprising:
an enclosure, the enclosure comprising a holder and a receiving portion, the holder defining a first slot, the first slot comprising a first position and a second position; and
a cover rotatably mounted to the enclosure, the cover being engaged with the enclosure to cover the receiving portion, the cover including:
a connecting arm;
a camshaft;
a pivot protruding from opposite sides of the connecting arm and, slidably located in the first slot; and
a driver mounted in the holder;
wherein the first position and the second position are at opposite ends of the slot, when the pivot is located at the second position, the holder resists the pivot to rotate the cover to open;
wherein when the cover is covering the receiving portion, the pivot is located at the first position, and the diver resists the camshaft elastically; and
wherein when the cover is disengaged from the enclosure, the pivot is driven by release of elasticity to slide from the first position to the second position to rotate and open the cover.

10. The cover with an opening structure of claim 9, wherein the driver comprises a elastic member and a shaft, when the cover is engaged with the enclosure to cover the receiving portion, the camshaft resists the shaft to force the elastic member to be compressed and when the cover is disengaged from the enclosure, the elastic force drives the pivot to slide in the slot to force the cover to rotate to open.

11. The cover with an opening structure of claim 10, wherein the shaft comprises:
a first end which resists the camshaft;
a second end which passes through the holder; and
a blocking portion located between the first end and the second end;
wherein the elastic member is located between and is configured to resist the blocking portion and the holder.

12. The cover with an opening structure of claim 11, wherein the holder protrudes from an underside of the enclosure and comprises:
a first positioning block;
a second positioning block; and
a third positioning block parallel to the first positioning block;
wherein the second positioning block is located between the first positioning block and the third positioning to cooperatively define a receiving groove to receive the holder.

13. The cover with an opening structure of claim 12, wherein the first slot is defined in the first positioning block, and the pivot is slid in the first slot, the second positioning block defines a positioning hole, the second end of the shaft is passed through the positioning hole.

14. The cover with an opening structure of claim 13, wherein the driver further comprises a positioning element, the positioning element is fixed on the second end of the shaft, when the cover is engaged with the enclosure to cover the opening, and the positioning element is configured to resist the second positioning block.

15. The cover with an opening structure of claim 9, wherein at least one hook is located at one of the enclosure and the cover, at least one second slot is located at the other one of the enclosure and the cover, and the hooks are latched into the second slots.

16. The cover with an opening structure of claim 15, wherein the hook comprises a cylinder, and the second slot is L-shaped.

17. A device comprising:
an enclosure defining an opening;
a holder coupled to the enclosure and defining a first slot having a first position and a second position;
a cover coupled to the enclosure, the cover is configured to cover the opening, and the cover comprises a connecting arm, a camshaft, and a pivot protruding from opposite sides of the connecting arm and being slidably located in the first slot;

a driver coupled to the holder and being configured to elastically resist the camshaft the driver comprising an elastic member and a shaft; and the cover configured to have a closed configuration and to transition to an open position by the driver;

wherein when the cover is engaged with the enclosure to cover the opening, the camshaft resists the shaft to force the elastic member to be compressed, and when the cover is disengaged from the enclosure, the elastic force drives the pivot to slide in the slot to force the cover to rotate to open.

18. The device of claim 17, wherein the first position and the second position are at opposite ends of the slot, when the pivot is located at the second position, the holder resists the pivot to rotate the cover to open.

19. The device of claim 18, wherein the driver further comprises a positioning element, the positioning element is fixed on the second end of the shaft, when the cover is engaged with the enclosure to cover the opening, the positioning element resists the second positioning block.

20. The device of claim 19, wherein the shaft comprising:
a first end which resists the camshaft;
a second end which passes through the holder; and
a blocking portion located between the first end and the second end;
wherein the elastic member is located between and is configured to resist the blocking portion and the holder.

* * * * *